United States Patent
Yang et al.

(12)

(10) Patent No.: US 10,847,458 B1
(45) Date of Patent: Nov. 24, 2020

(54) BEOL ELECTRICAL FUSE AND METHOD OF FORMING THE SAME

(71) Applicant: International Business Machines Corporation, Armonk, NY (US)

(72) Inventors: Chih-Chao Yang, Glenmont, NY (US); Baozhen Li, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/545,693

(22) Filed: Aug. 20, 2019

(51) Int. Cl.
   H01L 23/52      (2006.01)
   H01L 23/525     (2006.01)
   H01L 21/768     (2006.01)
   H01L 23/528     (2006.01)

(52) U.S. Cl.
   CPC ........ H01L 23/5256 (2013.01); H01L 21/768 (2013.01); H01L 23/528 (2013.01)

(58) Field of Classification Search
   CPC .............. H01L 21/768; H01L 23/5256; H01L 23/53223; H01L 23/53238; H01L 23/53295; H01L 23/528
   USPC .......................................... 438/132; 257/529
   See application file for complete search history.

(56) References Cited

U.S. PATENT DOCUMENTS

| | | | |
|---|---|---|---|
| 7,288,804 B2 | 10/2007 | Booth, Jr. et al. | |
| 8,053,862 B2 | 11/2011 | Greco | |
| 8,921,975 B2 | 12/2014 | Anderson et al. | |
| 9,024,411 B2 | 5/2015 | Li et al. | |
| 9,059,175 B2 | 6/2015 | Farooq et al. | |
| 9,093,453 B2 | 7/2015 | Li et al. | |
| 9,263,385 B1 | 2/2016 | Singh et al. | |
| 9,627,373 B2 | 4/2017 | Basker et al. | |
| 2006/0157819 A1 | 7/2006 | Wu | |
| 2006/0278895 A1* | 12/2006 | Burr | H01L 45/1286 257/209 |
| 2020/0111741 A1* | 4/2020 | Yang | H01L 23/5256 |

OTHER PUBLICATIONS

Rizzolo, R.F., "IBM System z9 eFUSE applications and methodology", IBM J. Res. & Dev., Jan./Mar. 2007, pp. 65-75, vol. 51 No. 1/2.

Kothandaraman, et al., "Electrically Programmable Fuse (eFUSE) Using Electromigration in Silicides", IEEE Electron Device Letters, Sep. 2002, pp. 523-525, vol. 23, No. 9.

* cited by examiner

Primary Examiner — Brook Kebede
(74) Attorney, Agent, or Firm — Scully, Scott, Murphy & Presser, P.C.; Alvin Borromeo, Esq.

(57) ABSTRACT

A BEOL eFuse is provided that includes a fuse element-containing layer having an entirely planar topmost surface. An upper portion of the fuse element-containing layer including the entirely planar topmost surface is present above a topmost surface of a second interconnect dielectric material layer, and a lower portion of the fuse-element containing layer is present in an opening that is formed in the second interconnect dielectric material layer and has a surface that contacts a first electrode structure that is partially embedded in a first interconnect dielectric material layer which underlies the second interconnect dielectric material layer. A second electrode structure that is present in a third interconnect dielectric material layer that overlies the second interconnect dielectric material layer contacts a portion of the planar topmost surface of the fuse-element-containing layer.

20 Claims, 4 Drawing Sheets

BEOL ELECTRICAL FUSE AND METHOD OF FORMING THE SAME

BACKGROUND

The present application relates to back-end-of-the-line (BEOL) electrical fuses (eFuses) and a method of forming the same.

eFuses are used in semiconductor industry to implement array redundancy, field programmable arrays, analog component trimming circuits and even as chip identification circuits. Dog-bone shaped eFuses containing a thin fuse link located between a thick cathode structure and a thick anode structure are known. Dog-bone shaped eFuses have increased current density. However, the fuse link dimension of prior art dog-bone shaped eFuses is limited by the allowable photolithographic minimal dimensions.

While eFuses are thus desirable within semiconductor device design and fabrication and provide an essential tool for cost effective and efficient semiconductor device design and fabrication, eFuses are not entirely without problems. For example, programming of prior art eFuses typically takes a substantial amount of current, which is undesirable in current technology node devices using low driving current. In addition, programming transistors takes up space in a semiconductor chip as well as power consumption.

There is a need to provide BEOL eFuses in which the fuse link is much smaller than conventional photolithographic minimum dimensions and thus the amount of electrical current that is needed to blow the eFuse can be substantially reduced as compared to a conventional eFuse design.

SUMMARY

A BEOL eFuse is provided that includes a fuse element-containing layer having an entirely planar topmost surface. An upper portion of the fuse element-containing layer including the entirely planar topmost surface is present above a topmost surface of a second interconnect dielectric material layer, and a lower portion of the fuse-element containing layer is present in an opening that is formed in the second interconnect dielectric material layer and has a surface that contacts a first electrode structure that is partially embedded in a first interconnect dielectric material layer which underlies the second interconnect dielectric material layer. A second electrode structure that is present in a third interconnect dielectric material layer that overlies the second interconnect dielectric material layer contacts a portion of the planar topmost surface of the fuse-element-containing layer. During programming of the structure, electrons flow in a vertically upward direction or vertically downward direction. After programming, a void is formed in a thin portion of the fuse element-containing layer that is located between the second and third interconnect dielectric material layers.

In one aspect of the present application, a structure is provided. In one embodiment, the structure includes an interconnect level including a first electrode structure partially embedded in a first interconnect dielectric material layer, wherein the first interconnect dielectric material layer has a recessed surface located laterally adjacent to the first electrode structure. A second interconnect dielectric material layer is located on the interconnect level. The second interconnect dielectric material layer has a recessed surface located above each recessed surface of the first interconnect dielectric material layer. A fuse element-containing layer having an entirely planar topmost surface is present on the second interconnect dielectric material layer, wherein the fuse element-containing layer extends entirely through the second interconnect dielectric material layer and contacts a surface of the first electrode structure. A third interconnect dielectric material layer is located on the planar topmost surface of the fuse element-containing layer, wherein the third interconnect dielectric material layer contains a second electrode structure that physically contacts a portion of the planar topmost surface of the fuse element-containing layer that is located above the recessed surface of the second interconnect dielectric material layer.

In another aspect of the present application, a method of forming a structure is provided. In one embodiment, the method includes forming an interconnect level comprising a first electrode structure partially embedded in a first interconnect dielectric material layer, wherein the first interconnect dielectric material layer has a recessed surface located laterally adjacent to the first electrode structure. Next, a second interconnect dielectric material layer is formed on the interconnect level, wherein the second interconnect dielectric material layer has a recessed surface and follows the contour of the interconnect level and has an opening that physically exposes a surface of the first electrode structure. A fuse element-containing layer is then formed on the second interconnect dielectric material layer and within the opening, the fuse element-containing layer having an entirely planar topmost surface. Next, a third interconnect dielectric material layer is formed on the planar topmost surface of the fuse element-containing layer, wherein the third interconnect dielectric material layer contains a second electrode structure that physically contacts a portion of the planar topmost surface of the fuse element-containing layer that is located above the recessed surface of the second interconnect dielectric material layer.

DETAILED DESCRIPTION

Figure 1:
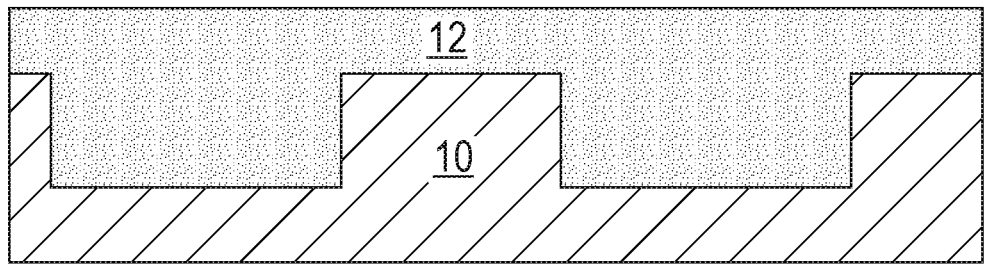
FIG. 1 is a cross sectional view of an exemplary structure that can be employed in accordance with an embodiment of the present application, wherein the exemplary structure includes an electrically conductive metal-containing layer located on a topmost surface of a first interconnect dielectric material layer and filling at least one opening that is present in the first interconnect dielectric material layer.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring first to FIG. 1, there is illustrated an exemplary structure that can be employed in accordance with an embodiment of the present application. As is shown, the exemplary structure of FIG. 1 includes an electrically conductive metal-containing layer 12 located on a topmost surface of a first interconnect dielectric material layer 10 and filling at least one opening (two are shown in FIG. 1 by way of one example) that is present in the first interconnect dielectric material layer 10.

It is noted that the drawings illustrate an area in which the e-Fuse in accordance with the present application will be subsequently formed. Other device areas including interconnect device areas can be located laterally adjacent to the fuse device area illustrated in the drawings of the present application. It is further noted that the first interconnect dielectric material layer 10 can be formed on a metal level (not shown) that is located above a front-end-of-the-line (FEOL) level (also not shown) that contains one or more semiconductor devices such as, for example, a transistor formed therein.

In some embodiments, the metal level is a middle-of-the-line (MOL) level. In other embodiments, the metal level is a lower interconnect level that is positioned beneath the first interconnect dielectric material layer 10. In either embodiment, the metal level includes a dielectric material layer that contains at least one metal level electrically conductive structure embedded therein that is connected, either directly or indirectly, to an underlying CMOS device (not shown) that is present in the FEOL level.

In embodiments in which the metal level is a MOL level, the dielectric material layer of the metal level can be composed of a MOL dielectric material such as, for example, silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than 4.0 (all dielectric constants expressed in this application are measured in a vacuum unless otherwise noted). Also, and in such an embodiment, the at least one metal level electrically conductive structure is a contact structure that includes a contact metal or a contact metal alloy such as, for example, tungsten (W), cobalt (Co), platinum (Pt), nickel (Ni) or alloys thereof.

In embodiments in which the metal level is an interconnect level, the dielectric material layer of the metal level can be composed of an interconnect dielectric material such as, for example, silicon dioxide, silsesquioxanes, C doped oxides (i.e., organosilicates) that includes atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like. Also, and in such an embodiment, the at least one metal level electrically conductive structure is composed of an electrically conductive metal or an electrically conductive metal alloy. Examples of electrically conductive materials that can be used in the present application include copper (Cu), aluminum (Al), or tungsten (W), while an example of an electrically conductive metal alloy is a Cu—Al alloy.

Referring back to FIG. 1, the first interconnect dielectric material layer 10 can be composed of an inorganic dielectric material or an organic dielectric material. In some embodiments, the first interconnect dielectric material layer 10 can be porous. In other embodiments, the first interconnect dielectric material layer 10 can be non-porous. Examples of suitable dielectric materials that can be employed as the first interconnect dielectric material layer 10 include, but are not limited to, one of the interconnect dielectric materials mentioned above for the metal level.

The first interconnect dielectric material layer 10 can have a dielectric constant that is about 4.0 or less. In one embodiment, the first interconnect dielectric material layer 10 has a dielectric constant of 2.8 or less. These dielectrics generally having a lower parasitic cross talk as compared to dielectric materials whose dielectric constant is greater than 4.0.

The first interconnect dielectric material layer 10 can be formed by a deposition process such as, for example, chemical vapor deposition (CVD), plasma enhanced chemical vapor deposition (PECVD) or spin-on coating. The first interconnect dielectric material layer 10 can have a thickness from 50 nm to 250 nm. Other thicknesses that are lesser than 50 nm, and greater than 250 nm can also be employed in the present application.

After providing the first interconnect dielectric material layer 10, at least one opening (not specifically shown) is formed into the first interconnect dielectric material layer 10; each opening will house a first electrode structure 12S and, if present, a diffusion barrier liner. The at least one opening that is present in the first interconnect dielectric material layer 10 is typically a via opening. The at least one opening can be formed by lithography and etching. Lithography includes forming a photoresist material (not shown) on a material or material stack that needs to be patterned. The photoresist material is then exposed to a pattern of irradiation, and thereafter the exposed photoresist material is developed utilizing a conventional resist developer. Etching can include a dry etching process and/or a wet etching process.

In some embodiments, a diffusion barrier material can be formed on the topmost surface of the first interconnect dielectric material layer 10 and within the at least one opening prior to forming the electrically conductive metal-containing layer 12; the diffusion barrier material will provide the diffusion barrier liner mentioned above. The diffusion barrier material can include Ta, TaN, Ti, TiN, Ru, RuN, RuTa, RuTaN, W, WN or any other material that can serve as a barrier to prevent a conductive material from diffusing there through. The thickness of the diffusion barrier material may vary depending on the deposition process used as well as the material employed. In some embodiments, the diffusion barrier material can have a thickness from 2 nm to 50 nm; although other thicknesses for the diffusion barrier material are contemplated and can be employed in the present application as long as the diffusion barrier material does not entirely fill the opening that is formed into the first interconnect dielectric material layer 10. The diffusion barrier material can be formed by a deposition process including, for example, chemical vapor deposition (CVD), plasma enhanced chemical vapor deposition (PECVD), atomic layer deposition (ALD), physical vapor deposition (PVD), sputtering, chemical solution deposition or plating.

The electrically conductive metal-containing layer 12 is formed into each opening and, if present, atop the diffusion barrier material. The electrically conductive metal-containing layer 12 is composed of an electrically conductive material that has a same or higher electromigration (EM) resistance than the fuse element material to be subsequently formed. In one embodiment, the electrically conductive metal-containing layer 12 can be composed of an electrically conductive metal, an electrically conductive metal alloy or an electrically conductive metal nitride. In such an embodiment, the electrically conductive metal-containing layer 12 can be composed of Ta, Ti, W, Co, Ru, Ir or Rh, or their nitrides or alloys. Other examples of electrically conductive materials for the electrically conductive metal-containing layer 12 include Cu, Al or a Cu—Al alloy. It is again noted that electrically conductive metal-containing layer 12 has a same or higher EM than the fuse element to be subsequently formed.

The electrically conductive metal-containing layer 12 can be formed utilizing a deposition process such as, for example, CVD, PECVD, sputtering, chemical solution deposition or plating. In one embodiment, a bottom-up plating process is employed in forming the electrically conductive metal or metal alloy. The electrically conductive-metal containing layer 12 is formed above the topmost surface of the first interconnect dielectric material layer 10 as shown in FIG. 1.

Figure 2:
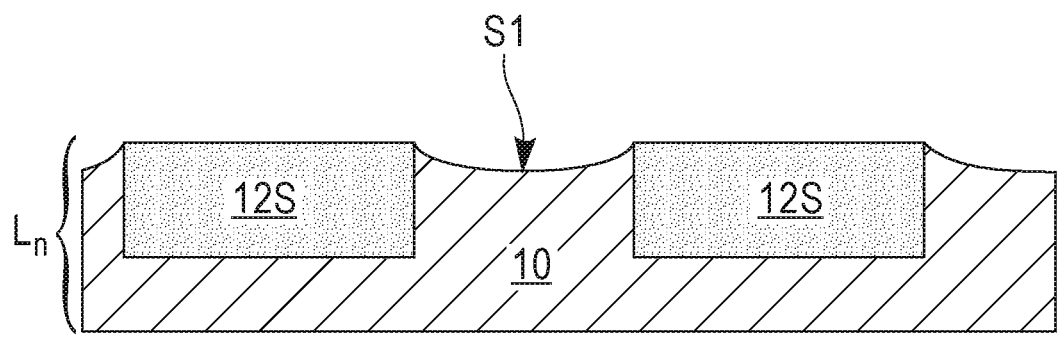
FIG. 2 is a cross sectional view of the exemplary structure of FIG. 1 after chemical mechanical polishing (CMP) of the electrically conductive metal-containing layer to provide an interconnect level including at least one first electrode structure partially embedded in the first interconnect dielectric material layer, wherein the CMP also recesses the first interconnect dielectric material layer and thus provides a recessed surface to the first interconnect dielectric material layer.

Referring now to FIG. 2, there is illustrated the exemplary structure of FIG. 1 after chemical mechanical polishing (CMP) of the electrically conductive metal-containing layer 12 to provide an interconnect level, $L_n$, including at least one first electrode structure 12S (two first electrode structure 12S are shown in FIG. 2 by way of one example) partially embedded in the first interconnect dielectric material layer 10, wherein the CMP also recesses (i.e., dishes out) the first interconnect dielectric material layer 10 and thus provides a recessed surface, S1, to the first interconnect dielectric material layer 10. The first electrode structure 12S may be referred to a bottom electrode structure of an eFuse device.

The recessing of the first interconnect dielectric material layer 10 occurs laterally adjacent to each first electrode structure 12S that is formed during the CMP process. In some embodiments of the present application (and as shown in FIG. 2), the recessed surface, S1, that is provided to the first interconnect dielectric material layer 10 during the CMP process is concave. By 'concave' is meant that a material structure has a surface that curves inward to provide a material structure that is thinner in the middle than on the edges.

Each first electrode structure 12S is present in one of the openings that is formed into the first interconnect dielectric material layer 10. Each first electrode structure 12S has a topmost surface that is located above the recessed surface, S1, of the first interconnect dielectric material layer 10.

In some embodiments, and when a diffusion barrier material is present, the CMP process also removes the diffusion barrier material from the topmost surface of the first interconnect dielectric material layer 10. The remaining portion of the diffusion barrier material that remains in the opening after this CMP process is referred to herein as the diffusion barrier liner, while the remaining portion of the electrically conductive metal-containing layer 12 that is present after this CMP process is referred to as the first electrode structure 12S. Collectively, the first interconnect dielectric material layer 10, each optional diffusion barrier liner, and each first electrode structure 12S define interconnect level, $L_n$. In the term "$L_n$," n can be 1, 2, 3, etc.

Figure 3:
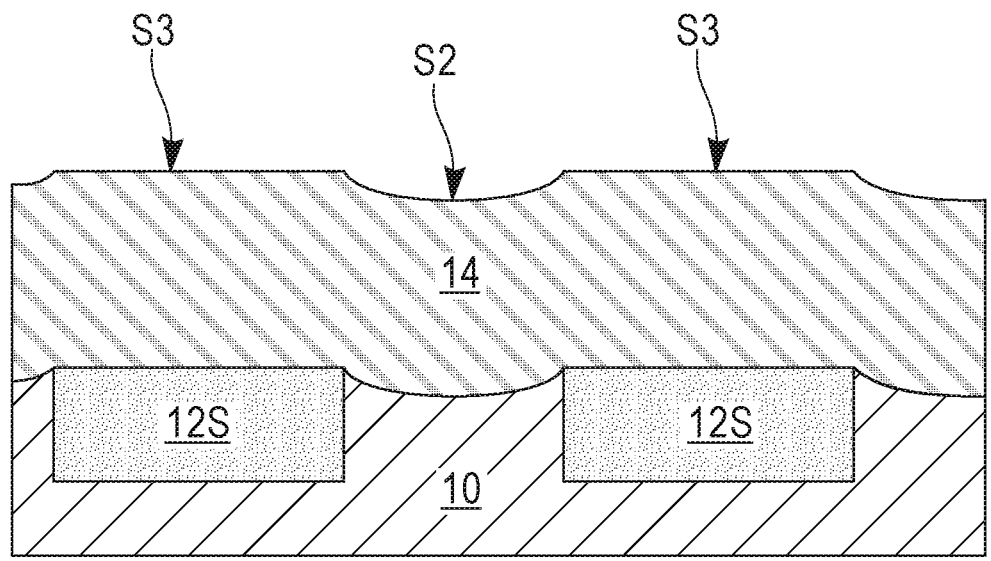
FIG. 3 is a cross sectional view of the exemplary structure of FIG. 2 after forming a second interconnect dielectric material layer on the interconnect level, wherein the second interconnect dielectric material layer follows the contour of the interconnect level.

Referring now to FIG. 3, there is illustrated the exemplary structure of FIG. 2 after forming a second interconnect dielectric material layer 14 on the interconnect level, wherein the second interconnect dielectric material layer 14 follows the contour of the interconnect level, $L_n$. As is shown in FIG. 3, the second interconnect dielectric material layer 14 is formed on physically exposed surfaces of each first electrode structure 12S, and the recessed surface, S1, of the first interconnect dielectric material layer 10.

The second interconnect dielectric material layer 14 can include one of the interconnect dielectric materials mentioned above for the first interconnect dielectric material layer 10. In some embodiments, the second interconnect dielectric material layer 14 can be composed of an interconnect dielectric material that is compositionally the same as the interconnect dielectric material that provides the first interconnect dielectric material layer 10. In other embodiments, the second interconnect dielectric material layer 14 can be composed of an interconnect dielectric material that is compositionally different from the interconnect dielectric material that provides the first interconnect dielectric material layer 10.

The second interconnect dielectric material layer 14 can be formed utilizing a conformal deposition process such as, for example, CVD, PECVD, or PVD. The second interconnect dielectric material layer 14 can have a thickness from 100 nm to 250 nm. Other thicknesses for the second interconnect dielectric material layer 14 are possible and thus can be used in the present application.

It is noted that the second interconnect dielectric material layer 14 has a recessed (i.e., dished out) surface, S2, that is identical to the recessed surface, S1, of the first interconnect dielectric material layer 10. In one embodiment, the recessed surface, S2, of the second interconnect dielectric material layer 14 is a concave surface. The recessed surface, S2, of the second interconnect dielectric material layer 14 is located laterally adjacent to a non-recessed surface, S3, of the second interconnect dielectric material layer 14. The non-recessed surface, S3, is located above the first electrode structure 12S that is partially embedded in the first interconnect dielectric material layer 10.

Figure 4:
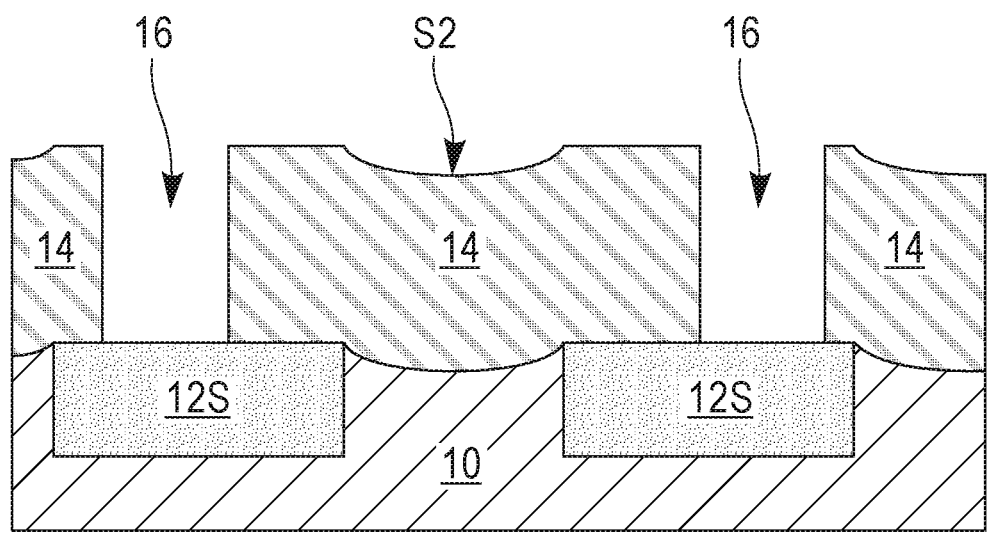
FIG. 4 is a cross sectional view of the exemplary structure of FIG. 3 after forming an opening into the second interconnect dielectric material layer that physically exposes a surface of the first electrode structure.

Referring now to FIG. 4, there is illustrated the exemplary structure of FIG. 3 after forming an opening 16 into the second interconnect dielectric material layer 14 that physically exposes a surface of the first electrode structure 12S. In the illustrated embodiment, two openings 16 are shown by way of one example. Each opening 16 that is formed into the second interconnect dielectric material layer 14 physically exposes a surface of one of the underlying first electrode structures 12S.

Each opening 16 can be formed by lithography, as defined above, and etching. Etching can include a dry etching process and/or a wet etching process. Each opening 16 that is formed can have a width that can be equal to, or less than, the width of the underlying first electrode structure 12S. Each opening 16 is formed through the non-recessed surface, S3, of the second interconnect dielectric material layer 14.

Figure 5:
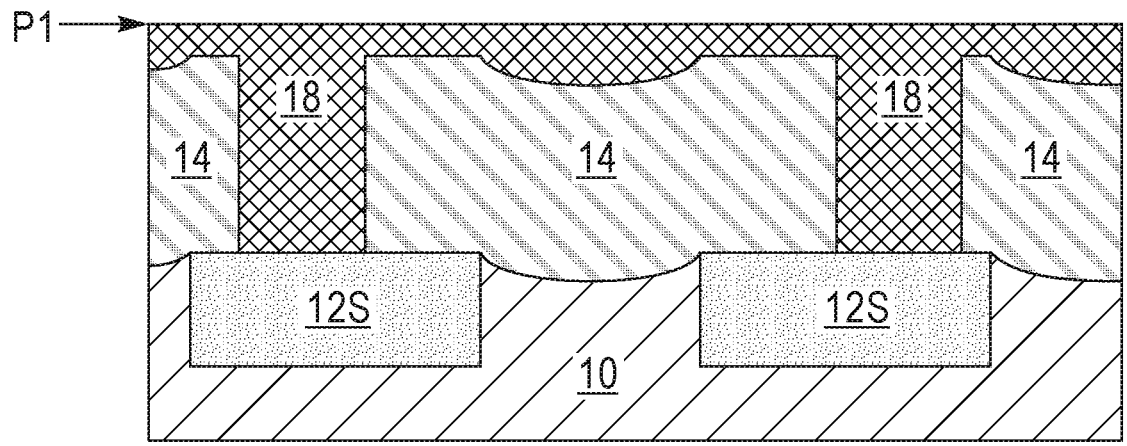
FIG. 5 is a cross sectional view of the exemplary structure of FIG. 4 after forming a fuse element-containing layer on the second interconnect dielectric material layer and within the opening, the fuse element-containing layer having an entirely planar topmost surface.

Referring now to FIG. 5, there is illustrated the exemplary structure of FIG. 4 after forming a fuse element-containing layer 18 on the second interconnect dielectric material layer 14 and within the opening 16, the fuse element-containing layer 18 having an entirely planar topmost surface, P1.

The fuse element-containing layer 18 is composed of a fuse element material (i.e., an electrically conductive material) such as, for example, Si, Cu, Al, SiN, CuN, AlN, or an alloy including at least two of Si, Cu and Al (i.e., a Cu—Al alloy). The fuse element-containing layer 18 can be formed by a deposition process, followed by a planarization process. The deposition process used in forming the fuse element-containing layer 18 can include, for example, CVD, PECVD, atomic layer deposition (ALD), PVD, sputtering, or plating. The planarization process can include CMP and/or grinding.

In some embodiments, the fuse element-containing layer can be formed by first forming a fuse element-containing seed layer (not shown). Next, a reflow anneal process is performed that reflows the fuse element-containing seed layer, and thereafter a planarization process is performed. The fuse element-containing seed layer can be composed of one of the fuse element materials mentioned above. The reflow anneal can include a furnace anneal or a laser anneal; laser annealing is typically performed for a shorter period of time than furnace anneal. The reflow anneal is performed at a temperature that melts the fuse material such that the same flows into and fills each opening 16. As is known to those skilled in the art, capillary force/surface tension is the driving force pulling the fuse element into each opening 16. In one example, and when the reflow anneal is performed in a furnace, the 'furnace' reflow anneal can be performed at a temperature from 60° C. to 500° C. for a time period from 10 minutes to 6 hours. In another example, and when the reflow anneal is performed using a laser, the 'laser' reflow anneal is performed at a temperature from 400° C. to 1000° C. for a time period of a few nanoseconds.

At this point of the present application, the fuse element-containing layer 18 is removed from non-fuse device areas of the structure, while leaving the fuse element-containing layer 18 in the fuse device area shown in the drawings. The removal of the fuse element-containing layer 18 from non-fuse device areas of the structure can be performed utilizing a patterning process including, for example, lithography and etching.

Figure 6:
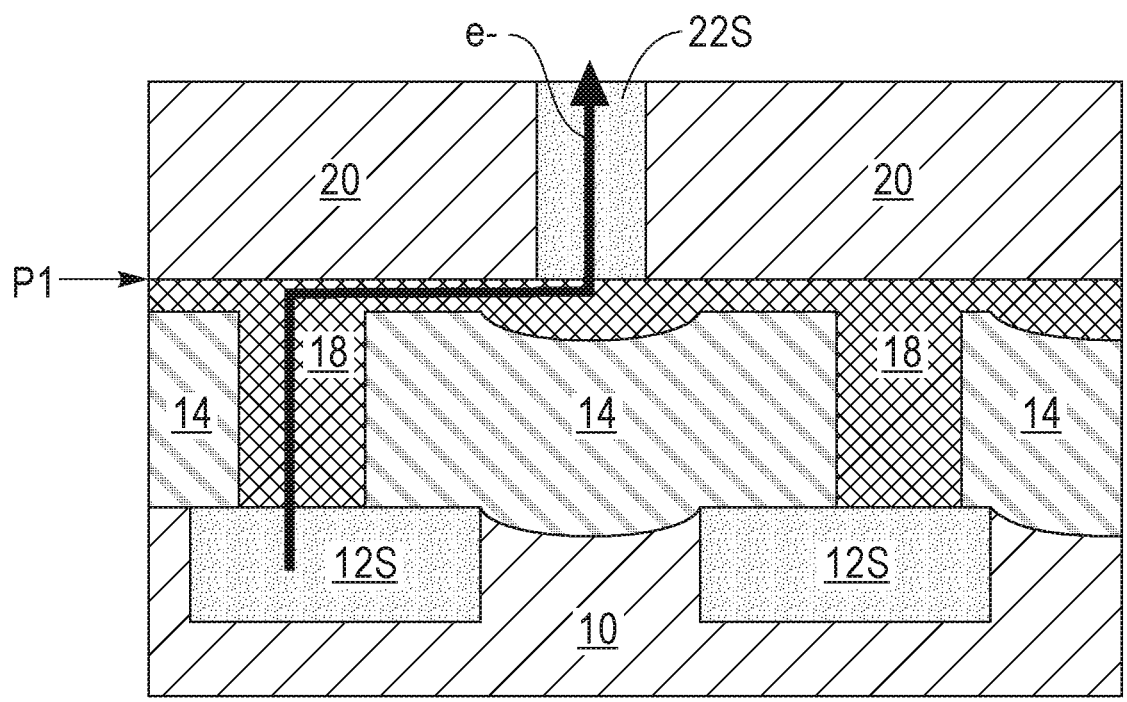
FIG. 6 is a cross sectional view of the exemplary structure of FIG. 5 after forming a third interconnect dielectric material layer on the planar topmost surface of the fuse element-containing layer, wherein the third interconnect dielectric material layer contains a second electrode structure that physically contacts a portion of the planar topmost surface of the fuse element-containing layer that is located above the recessed surface of the second interconnect dielectric material layer.

Referring now to FIG. 6, there is illustrated the exemplary structure of FIG. 5 after forming a third interconnect dielectric material layer 20 on the planar topmost surface, P1, of the fuse element-containing layer 18, wherein the third interconnect dielectric material layer 20 contains a second electrode structure 22S (i.e., a top electrode structure) that physically contacts a portion of the planar topmost surface, P1, of the fuse element-containing layer 18 that is located above the recessed surface, S2, of the second interconnect dielectric material layer 14. As is shown in FIG. 6, the second electrode structure 22S is vertically off-set from the first electrode structure 12S.

In the illustrated embodiment, a single second electrode structure 22S is formed. In other embodiments, a plurality of second electrode structure 22S can be formed into the third interconnect dielectric material layer 20. In such an embodiment, each second electrode structure 22S contacts a portion of the planar topmost surface, P1, of the fuse element-containing layer 18 that is located above one of the recessed surfaces, S2, of the second interconnect dielectric material layer 14.

The third interconnect dielectric material layer 20 can include one of the interconnect dielectric materials mentioned above for the first interconnect dielectric material layer 10. In some embodiments, the third interconnect dielectric material layer 20 can be composed of an interconnect dielectric material that is compositionally the same as the interconnect dielectric material that provides the first interconnect dielectric material layer 10 and/or the second interconnect dielectric material layer 14. In other embodiments, the can be composed of an interconnect dielectric material that is compositionally different from the interconnect dielectric material that provides the first interconnect dielectric material layer 10 and/or the second interconnect dielectric material layer 14.

The third interconnect dielectric material layer 20 can be formed utilizing a deposition process such as, for example, CVD, PECVD, PVD or spin-on coating. The third interconnect dielectric material layer 20 can have a thickness from 100 nm to 250 nm. Other thicknesses for the third interconnect dielectric material layer 20 are possible and thus can be used in the present application.

The second electrode structure 22S can be formed into the third electrically conductive structure by first forming, by lithography and etching, an opening into the third interconnect dielectric material layer 20. An optional diffusion barrier material, as defined above, can be formed on the topmost surface of the third interconnect dielectric material layer 20 and lining the opening that is formed into the third interconnect dielectric material layer 20. An electrically conductive material, as defined above, that has a same or higher electromigration (EM) resistance than the fuse element material that provides the fuse element-containing layer 18 can then be formed on the optionally diffusion barrier material or on the topmost surface of the third interconnect dielectric material layer 20 and within the opening that is formed into the third interconnect dielectric material layer 20.

The electrically conductive material that provides second electrode structure 22S can be composed of an electrically conductive metal, an electrically conductive metal alloy or an electrically conductive metal nitride. Exemplary electrically conductive materials that can be used to provide the second electrode structure 22S include Ta, Ti, W, Co, Ru, Ir or Rh, or their nitrides or alloys. Other examples of electrically conductive materials that can be used as the second electrode structure 22S include Cu, Al or a Cu—Al alloy. In one embodiment, the second electrode structure 22S can be composed of a compositionally same electrically conductive material as the first electrode structure 12S. In another embodiment, the second electrode structure 22S can be composed of a compositionally different electrically conductive material as the first electrode structure 12S. In either embodiment, the electrically conductive material that provides the first and second electrode structure has a same or higher electromigration (EM) resistance than the fuse element material that provides the fuse element-containing layer 18.

A planarization process such as, for example, CMP and/or grinding is then performed to provide the exemplary structure shown in FIG. 6. The electrically conductive metal layer or electrically conductive metal alloy layer that remains in the opening after this planarization process defines the second electrode structure 22S. If present, the diffusion barrier material that remains in the opening after this planarization process defines a diffusion barrier liner.

The electrically conductive material that provides the second electrode structure 22S can be formed utilizing a deposition process such as, for example, CVD, PECVD, sputtering, chemical solution deposition or plating. In one embodiment, a bottom-up plating process is employed in forming the electrically conductive material that provides the second electrode structure 22S.

In some embodiments and as shown in FIG. 6, the second electrode structure 22S has a topmost surface that is coplanar with a topmost surface of the third interconnect dielectric material layer 20. In other embodiments (not shown), the second electrode structure 22S has a topmost surface that is located above or below a topmost surface of the third interconnect dielectric material layer 20.

Notably, FIG. 6 illustrates an exemplary structure of the present application prior to programming and thus blowing the fuse element-containing layer 18. The exemplary structure of FIG. 6 includes an interconnect level including a first electrode structure 12S partially embedded in a first interconnect dielectric material layer 10, wherein the first interconnect dielectric material layer 10 has a recessed surface, S1, located laterally adjacent to the first electrode structure 12S. A second interconnect dielectric material layer 14 is located on the interconnect level. The second interconnect dielectric material layer 14 follows the contour of the interconnect level and thus has a recessed surface located above each recessed surface, S1, of the first interconnect dielectric material 10. A fuse element-containing layer 18 having an entirely planar topmost surface, P1, is present on the second interconnect dielectric material layer 14. In the present application, the fuse element-containing layer extends entirely through the second interconnect dielectric material layer and contacts a surface of the first electrode structure 12S. A third interconnect dielectric material layer 20 is located on the planar topmost surface, P1, of the fuse element-containing layer 18, wherein the third interconnect dielectric material layer 20 contains a second electrode structure 22S that physically contacts a portion of the planar topmost surface, P1, of the fuse element-containing layer 18 that is located above the recessed surface, S2, of the second interconnect dielectric material layer 14. Prior to programming the exemplary structure has a resistance, R1, that is constant over time. Also, and prior to programming, the exemplary structure shown in FIG. 6 has a void-less fuse element-containing layer 18.

During programming of the exemplary structure shown in FIG. 6, electrons, $e^-$, move in a vertically upward direction or vertically downward direction. Notably, FIG. 6 illustrates an embodiment in which the electrons flow vertically upward from the first electrode structure 12S through the fuse element-containing layer 18 and into the second electrode structure 22S. In other embodiments, the movement of electrons is reversed from that shown in FIG. 6. During programming, the exemplary structure has a resistance that is exponentially increasing from R1 over time.

Figure 7:
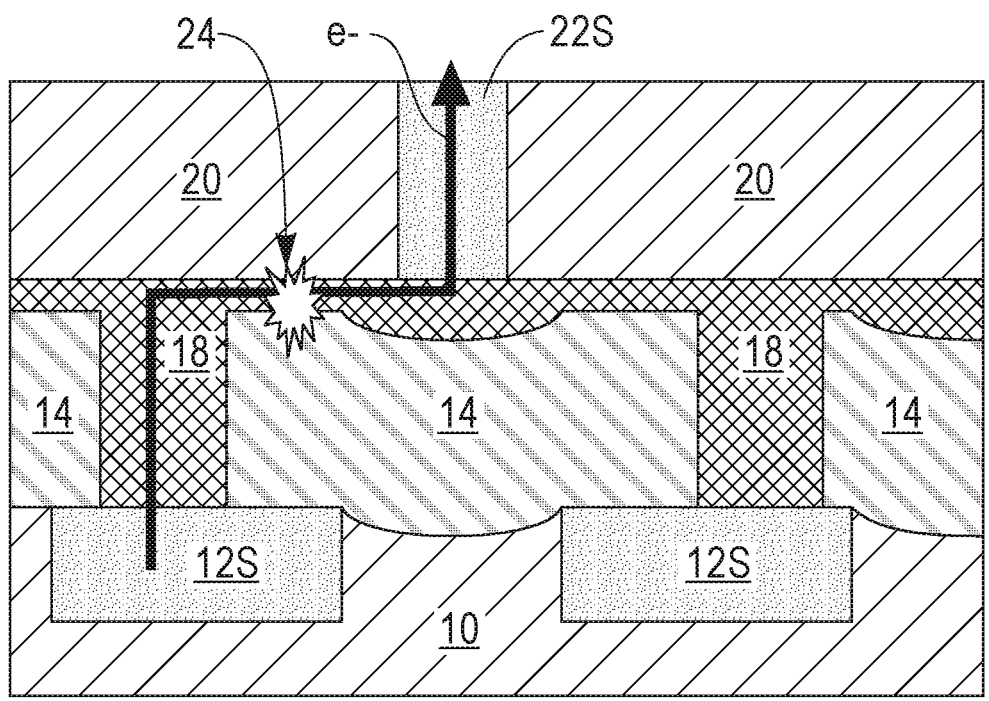
FIG. 7 is a cross sectional view of the exemplary structure of FIG. 6 after programming in which a void is formed in a thin portion of the fuse element-containing layer that is located between the second interconnect dielectric material layer and the third interconnect dielectric material layer.

Referring now to FIG. 7, there is illustrated the exemplary structure of FIG. 6 after programming in which a void 24 is formed in a thin portion of the fuse element-containing layer 18 that is located between the second interconnect dielectric material layer 14 and the third interconnect dielectric material layer 20. Although not shown, other voids can form along the other thin portions of the fuse element-containing layer 18 that are located between the second and third interconnect dielectric material layers 14 and 20. After programming, the structure of FIG. 7 has a resistance, R2, which is constant over time, wherein R2 is greater than R1. In some embodiments, R2/R1 is greater than 10.

Programming can be achieved utilizing techniques well known in the e-Fuse art. For example, programming can be achieved by pushing higher electrical current to initiate electromigration failure.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A structure comprising:
    an interconnect level comprising at least one first electrode structure partially embedded in a first interconnect dielectric material layer, wherein the first interconnect dielectric material layer has a recessed surface located laterally adjacent to the first electrode structure;
    a second interconnect dielectric material layer located on the interconnect level, wherein the second interconnect dielectric material layer has a recessed surface located above each recessed surface of the first interconnect dielectric material layer;
    a fuse element-containing layer having an entirely planar topmost surface present on the second interconnect dielectric material layer, wherein the fuse element-containing layer extends entirely through the second interconnect dielectric material layer and contacts a surface of the first electrode structure; and
    a third interconnect dielectric material layer located on the planar topmost surface of the fuse element-containing layer, wherein the third interconnect dielectric material layer contains a second electrode structure that physically contacts a portion of the planar topmost surface of the fuse element-containing layer that is located above the recessed surface of the second interconnect dielectric material layer.

2. The structure of claim 1, wherein the fuse element-containing layer is void-less.

3. The structure of claim 1, wherein at least one void is located in a thin portion of the fuse element-containing layer, wherein the thin portion of the fuse element-containing layer is located between the second interconnect dielectric material layer and the third interconnect dielectric material layer.

4. The structure of claim 1, wherein each of the first electrode structure and the second electrode structure is composed of a conductive material that has a same or higher electromigration (EM) resistance than a fuse element material that provides the fuse element-containing layer.

5. The structure of claim 4, wherein the fuse element material comprises Si, Cu, Al, SiN, CuN, AlN, or an alloy including at least two of Si, Cu and Al.

6. The structure of claim 4, wherein the conductive material that provides the first electrode structure and the second electrode structure comprises Ta, Ti, W, Co, Ru, Ir or Rh, or their nitrides or alloys.

7. The structure of claim 4, wherein the conductive material that provides the first electrode structure and the second electrode structure comprises Cu, Al or a Cu—Al alloy.

8. The structure of claim 1, wherein the recessed surface of the first interconnect dielectric material layer and the recessed surface of the second interconnect dielectric material layer are both concave surfaces.

9. The structure of claim 1, wherein the first electrode structure is vertically off-set from the second electrode structure.

10. The structure of claim 1, wherein electrons flow in a vertically upward direction or a vertically downward direction.

11. A method of forming a structure, the method comprising:
    forming an interconnect level comprising a first electrode structure partially embedded in a first interconnect dielectric material layer, wherein the first interconnect dielectric material layer has a recessed surface located laterally adjacent to the first electrode structure;
    forming a second interconnect dielectric material layer on the interconnect level, wherein the second interconnect dielectric material layer has a recess surface and follows the contour of the interconnect level and has an opening that physically exposes a surface of the first electrode structure;
    forming a fuse element-containing layer on the second interconnect dielectric material layer and within the opening, the fuse element-containing layer having an entirely planar topmost surface; and
    forming a third interconnect dielectric material layer on the planar topmost surface of the fuse element-containing layer, wherein the third interconnect dielectric material layer contains a second electrode structure that physically contacts a portion of the planar topmost surface of the fuse element-containing layer that is located above the recessed surface of the second interconnect dielectric material layer.

12. The method of claim 11, wherein the forming of the at least one first electrode structure partially embedded in the first interconnect dielectric material layer comprises:
    depositing an electrically conductive metal-containing layer on the topmost surface of a first interconnect dielectric material layer and filling the at least one opening that is present in the first interconnect dielectric material layer; and
    chemical mechanical polishing (CMP) the electrically conductive metal-containing layer to provide the interconnect level.

13. The method of claim 11, wherein the forming of the fuse element-containing layer on the second interconnect dielectric material layer and within the opening comprises:
    depositing a fuse element material; and
    planarizing the fuse element material.

14. The method of claim 11, wherein the fuse element-containing layer is void-less.

15. The method of claim 11, further comprising programming the structure, wherein the programming forms at least one void a thin portion of the fuse element-containing layer, wherein the thin portion of the fuse element-containing layer is located between the second interconnect dielectric material layer and the third interconnect dielectric material layer.

16. The method of claim 11, wherein each of the first electrode structure and the second electrode structure is composed of a conductive material that has a same or higher electromigration (EM) resistance than a fuse element material that provides the fuse element-containing layer.

17. The method of claim 16, wherein the fuse element material comprises Si, Cu, Al, SiN, CuN, AlN, or an alloy including at least two of Si, Cu and Al.

18. The method of claim 16, wherein the conductive material that provides the first electrode structure and the second electrode structure comprises Ta, Ti, W, Co, Ru, Ir or Rh, or their nitrides or alloys.

19. The method of claim 16, wherein the conductive material that provides the first electrode structure and the second electrode structure comprises Cu, Al or a Cu—Al alloy.

20. The method of claim 11, wherein the recessed surface of the first interconnect dielectric material layer and the recessed surface of the second interconnect dielectric material are both concave surfaces.

* * * * *